(12) United States Patent
Yang

(10) Patent No.: US 11,409,171 B2
(45) Date of Patent: Aug. 9, 2022

(54) DISPLAY PANEL, MANUFACTURING METHOD THEREOF AND DISPLAY APPARATUS

(71) Applicant: HKC CORPORATION LIMITED, Shenzhen (CN)

(72) Inventor: Chunhui Yang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 567 days.

(21) Appl. No.: 16/349,993

(22) PCT Filed: Nov. 30, 2018

(86) PCT No.: PCT/CN2018/118437
§ 371 (c)(1),
(2) Date: May 15, 2019

(87) PCT Pub. No.: WO2020/098001
PCT Pub. Date: May 22, 2020

(65) Prior Publication Data
US 2021/0356826 A1 Nov. 18, 2021

(30) Foreign Application Priority Data
Nov. 12, 2018 (CN) .......................... 201811338823.X

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *H01L 27/1237* (2013.01); *H01L 27/1248* (2013.01)

(58) Field of Classification Search
CPC ....... G02F 1/136286–136295; H01L 27/1214; H01L 27/1222; H01L 27/1248; H01L 27/1237
See application file for complete search history.

(56) References Cited

U.S. PATENT DOCUMENTS

| | | | |
|---|---|---|---|
| 2012/0322182 A1 | 12/2012 | Yang et al. | |
| 2016/0041441 A1 | 2/2016 | Park et al. | |
| 2018/0067368 A1* | 3/2018 | Izawa | G02F 1/1368 |

FOREIGN PATENT DOCUMENTS

| | | | | |
|---|---|---|---|---|
| CN | 105093639 A | | 11/2015 | |
| CN | 105137645 A | * | 12/2015 | ....... G02F 1/136286 |

(Continued)

OTHER PUBLICATIONS

International Search Report issued in corresponding International application No. PCT/CN2018/118437, dated Nov. 30, 2018.

(Continued)

*Primary Examiner* — Mariceli Santiago

(57) ABSTRACT

The present application discloses a display panel, a manufacturing method and a display apparatus. The display panel includes: a first substrate; a first metal layer formed on the first substrate; a second metal layer; and a black color resistance layer formed between the first metal layer and the second metal layer; the first metal layer is a scan line, the second metal layer is a data line, and an insulating layer and the black color resistance layer are disposed at the intersection of the scan line and the data line.

8 Claims, 8 Drawing Sheets

(56) References Cited

FOREIGN PATENT DOCUMENTS

| | | | |
|---|---|---|---|
| CN | 207742427 U | 8/2018 | |
| JP | 2012230326 A | * 11/2012 | |
| KR | 20160131961 A | * 11/2016 | ......... C23C 14/0015 |

OTHER PUBLICATIONS

Written Opinion of the International Searching Authority for No. PCT/CN2018/118437.
First Office Action from China patent office in a counterpart Chinese patent Application 201811338823.X, dated Feb. 18, 2020 (6 pages).
N Office Action from China patent office in a counterpart Chinese patent Application 201811338823.X, dated Mar. 7, 2020 (3 pages).

* cited by examiner

DISPLAY PANEL, MANUFACTURING METHOD THEREOF AND DISPLAY APPARATUS

The present application claims priority to the Chinese Patent Application No. CN201811338823. X, filed with the Chinese Patent Office on Nov. 12, 2018, and entitled "DISPLAY PANEL, MANUFACTURING METHOD AND DISPLAY APPARATUS", which is incorporated herein by reference in its entirety.

TECHNICAL FIELD

The present application relates to the technical field of display, and in particular, to a display panel, a manufacturing method and a display apparatus.

BACKGROUND

The description here only provides background information related to the present application, and does not necessarily constitute the existing technology.

The liquid crystal display (LCD) has numerous advantages such as thin body, power saving and no radiation, and is widely applied. For example, a liquid crystal television, a mobile phone, a personal digital assistant, a digital camera, a computer screen or a laptop screen are dominant in the field of panel display. With constant development of display technology, resolution of a high-quality display panel becomes increasingly higher, but shortages like crosstalk, image sticking and so on appear.

Taking a switch structure, a thin film transistor (TFT), of the display panel as an example, how to reduce parasitic capacitance between a first metal layer and a second metal layer of the thin film transistor (TFT) so as to reduce a load of the first metal layer and the second metal layer becomes the burning question.

SUMMARY

To realize the above purpose, the present application provides a display panel, a manufacturing method and a display apparatus capable of reducing a circuit load.

A display panel includes: a first substrate; a first metal layer formed on the first substrate; a second metal layer; an insulating layer formed between the first metal layer and the second metal layer; and a black color resistance layer formed between the first metal layer and the second metal layer.

Optionally, the first metal layer is a scan line, the second metal layer is a data line, and the insulating layer and the black color resistance layer are disposed at the intersection of the scan line and the data line.

Optionally, the display panel includes a semiconductor layer disposed between the first metal layer and the second metal layer.

Optionally, the first metal layer forms a grid electrode, the second metal layer forms a source electrode and a drain electrode that are independent of each other, and the source electrode is connected with the drain electrode through the semiconductor layer.

Optionally, the insulating layer is a grid electrode insulating layer formed between the grid electrode and the semiconductor layer.

Optionally, the black color resistance layer is disposed on the grid electrode; one part of the black color resistance layer covers the grid electrode and another part does not cover the grid electrode; a part of the source electrode is disposed on the black color resistance layer, and another part is disposed on the semiconductor layer; and at least a part of the drain electrode is disposed on the semiconductor layer.

Optionally, the grid electrode insulating layer is formed on the black color resistance layer, and the semiconductor layer is formed on the grid electrode insulating layer.

Optionally, the area of the semiconductor layer is less than that of the grid electrode, and the disposing position of the semiconductor layer corresponds to a non-edge area of the grid electrode.

Optionally, the black color resistance layer is provided with an opening; a distance from the periphery of the opening to the outer edge of the black color resistance layer is greater than 0; and the semiconductor layer is disposed in an area of the opening.

The present application also discloses a manufacturing method of a display panel including steps of:
  providing a first substrate;
  forming a first metal layer; forming a black color resistance layer and an insulating layer;
  forming a second metal layer;
  The insulating layer the black color resistance layer are disposed between the first metal layer and the second metal layer.

Optionally, after the step of forming the black color resistance layer and the insulating layer, it further includes a step of:
  forming a semiconductor layer.

Optionally, after the step of forming the second metal layer, it further includes steps of:
  forming a passivation layer on the second metal layer;
  forming a through hole on the passivation layer.

Optionally, after forming the passivation layer on the second metal layer and forming the through hole on the passivation layer, it further includes a step of:
  forming a transparent conductive layer connected with the second metal layer through the through hole.

Optionally, in the step of forming the black color resistance layer, the black color resistance layer is formed with an opening for forming the grid electrode insulating layer.

Optionally, a distance from the periphery of the opening to the outer edge of the black color resistance layer is greater than 0.

Optionally, the semiconductor layer is disposed in an area of the opening.

The present application also discloses a display apparatus that includes a display panel; the display panel includes: a first substrate; a first metal layer formed on the first substrate; a second metal layer; an insulating layer formed between the first metal layer and the second metal layer; and a black color resistance layer formed between the first metal layer and the second metal layer.

Under comparison between this scheme and the scheme in which the first metal layer and the second metal layer are not provided with a black color resistance layer, when a distance between the first metal layer and the second metal layer is close, the first metal layer and the second metal layer will generate large coupling capacitance, so that the circuit load of the first metal layer and the second metal layer increases, thereby causing bad quality of the display panel. In this scheme, a layer of black color resistance layer is added between the first metal layer and the second metal layer; since the black color resistance layer has a certain thickness, the distance between the first metal layer and the second metal layer increases, so that the coupling capacitance between the first metal layer and the second metal layer decreases, thereby decreasing the circuit load of the first metal layer and the second metal layer; in addition, the dielectric property of the black color resistance layer is different from the common insulating layer, the adjustable range of the film thickness of the black color resistance layer is larger; meanwhile, since the distance between the first metal layer and the second metal layer increases, the possibility of light leakage between the first metal layer and the second metal layer increases for the light laterally striking the first metal layer and the second metal layer; the black color resistance layer can block the lateral light, which decreases light leakage, improves the display effect and guarantees the quality of the display panel.

BRIEF DESCRIPTION OF DRAWINGS

The drawings are included to provide detailed understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

Figure 1:
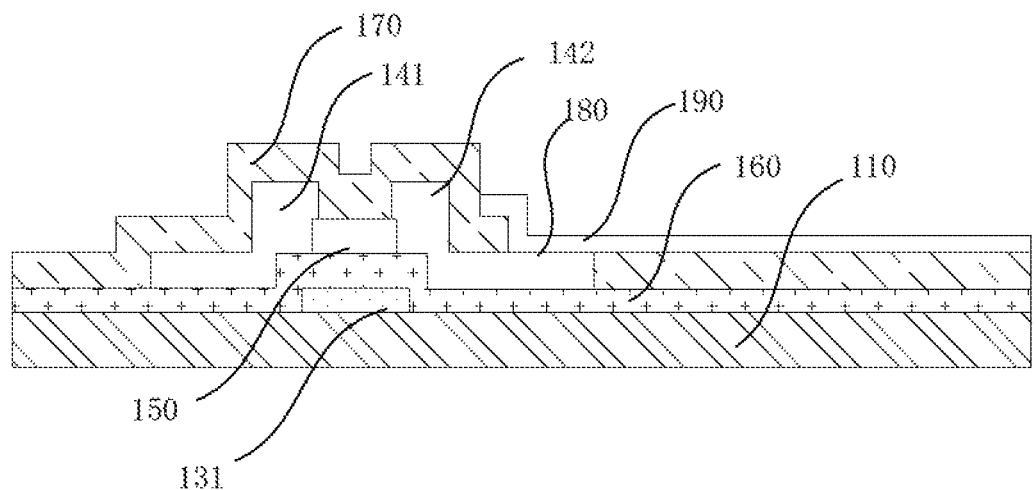
FIG. 1 is a structural schematic diagram of a display panel of one or more embodiments in the present application.

It should be understood that, the terms used herein, the disclosed specific structure and function details are merely intended to describe specific embodiments and are representative. However, the present application can be specifically embodied in many alternative forms, and should not be interpreted to be limited to the embodiments described herein.

In description of the present application, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features; "a plurality of" means two or more, unless otherwise stated. The term "include" and any variations thereof are intended to cover a non-exclusive inclusion; there may be the presence or addition of one or more other features, integers, steps, operations, elements, components and/or combinations thereof.

In addition, orientation or position relationships indicated by the terms "center", "transversal", "upper", "lower", "left", "right", "vertical", "horizontal", "top", "bottom", "inner", "outer", etc. are based on the orientation or relative position relationships as shown in the drawings, for ease of the description of the present application and simplifying the description only, rather than indicating that the indicated device or element must have a particular orientation or be constructed and operated in a particular orientation. Therefore, these terms should not be understood as a limitation to the present application.

In addition, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The present application is illustrated below in detail in reference with the drawings and optional embodiments.

As shown in FIGS. 1 to 11, in one or more embodiments of the present application discloses a display panel 100 including:

a first substrate 110; a first metal layer 130 formed on the first substrate; a second metal layer 140; an insulating layer 160 formed between the first metal layer and the second metal layer; and a black color resistance layer 120 formed between the first metal layer 130 and the second metal layer 140.

Under comparison between this scheme and the scheme in which the first metal layer 130 and the second metal layer 140 are not provided with a black color resistance layer 120, when a distance between the first metal layer 130 and the second metal layer 140 is close, the first metal layer 130 and the second metal layer 140 will generate large coupling capacitance, so that the circuit load of the first metal layer 130 and the second metal layer increases, thereby causing bad quality of the display panel 100. In this scheme, a layer of black color resistance layer 120 is added between the first metal layer 130 and the second metal layer 140; since the black color resistance layer 120 has a certain thickness, the distance between the first metal layer and the second metal layer 140 increases, so that the coupling capacitance between the first metal layer 130 and the second metal layer 140 decreases, thereby decreasing the circuit load of the first metal layer 130 and the second metal layer 140; in addition, the dielectric property of the black color resistance layer is different from the common insulating layer, the adjustable range of the film thickness of the black color resistance layer is larger; meanwhile, since the distance between the first metal layer 130 and the second metal layer 140 increases, the possibility of light leakage between the first metal layer 130 and the second metal layer 140 increases for the light laterally striking the first metal layer 130 and the second metal layer 140; the black color resistance layer can block the lateral light, which decreases light leakage, improves the display effect and guarantees the quality of the display panel 100.

Figure 2:
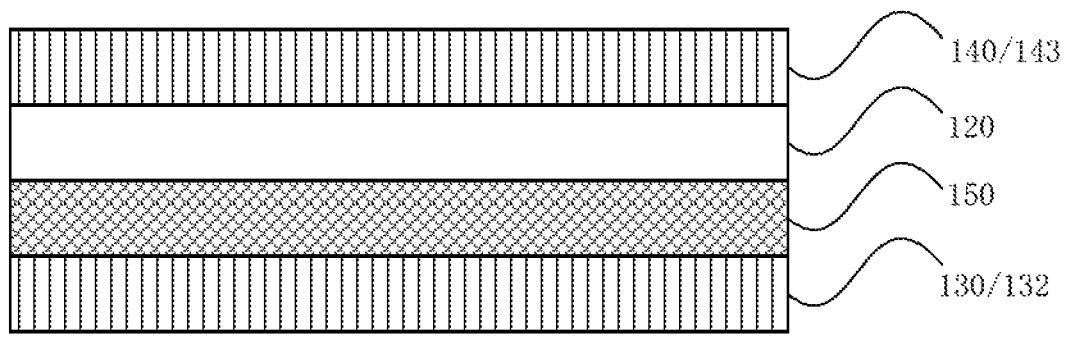
FIG. 2 is a structural schematic diagram of another display panel of one or more embodiments in the present application.
Figure 3:
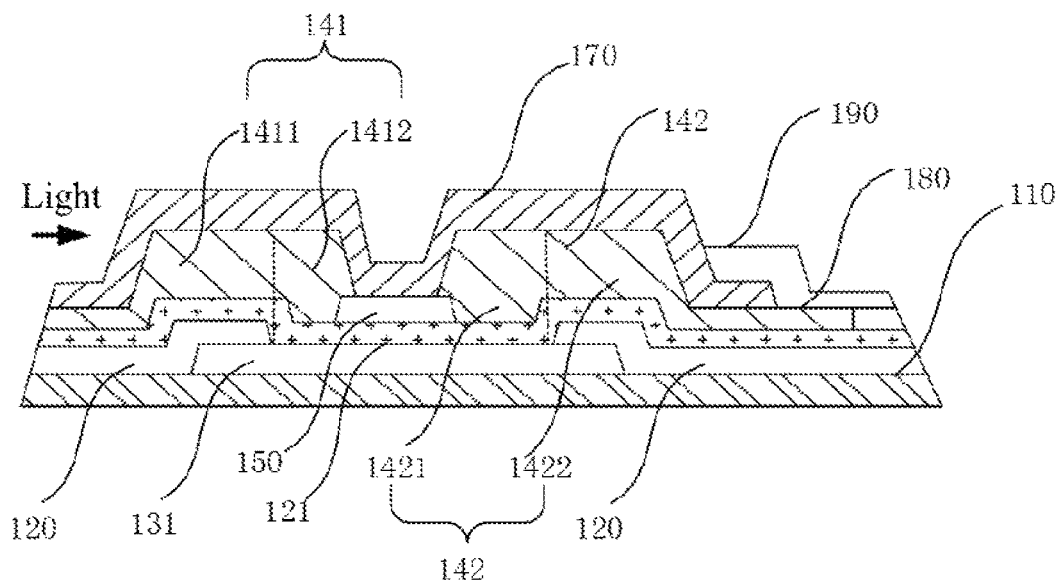
FIG. 3 is a structural schematic diagram of another display panel of one or more embodiments in the present application.
Figure 4:
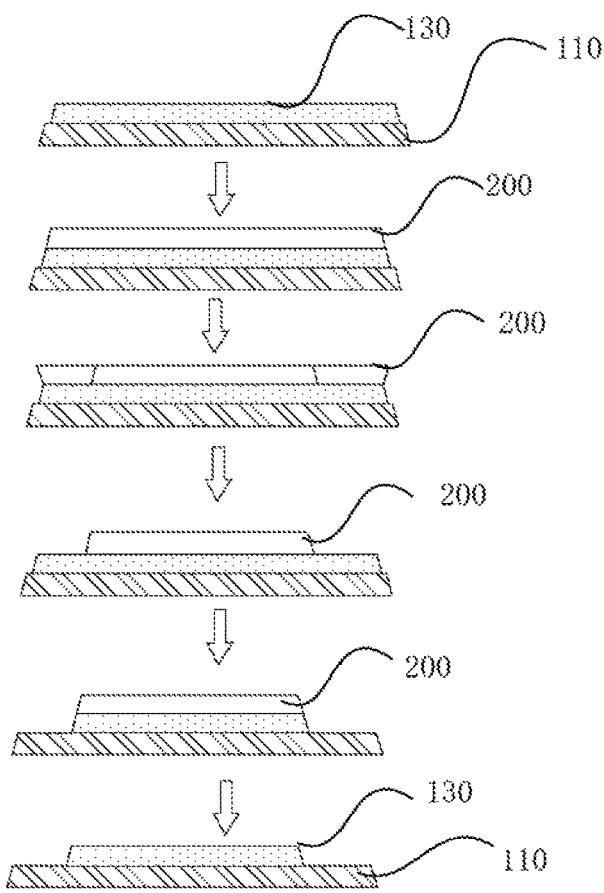
FIG. 4 is a schematic diagram of a display panel manufacture procedure of one or more embodiments in the present application.
Figure 5:
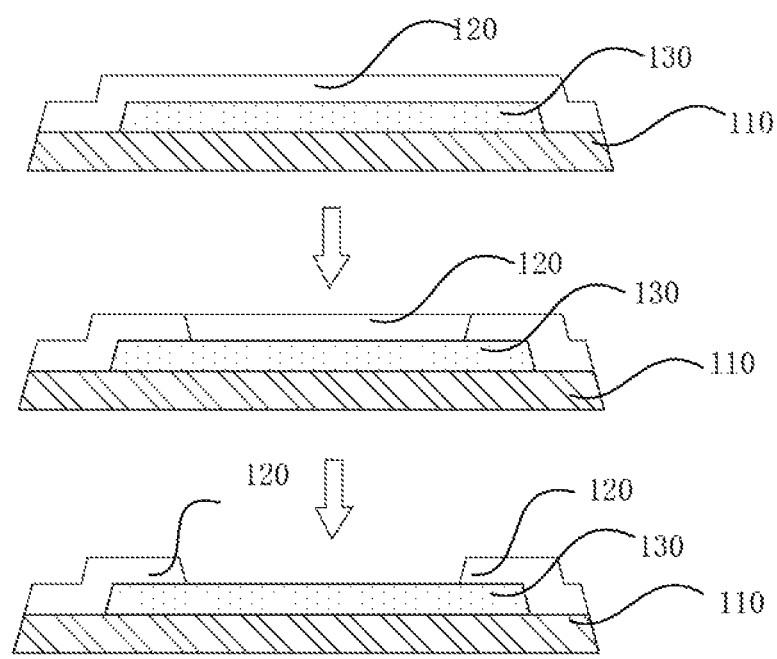
FIG. 5 is a schematic diagram of a display panel manufacture procedure of one embodiments in the present application.

In one or more embodiments, as shown in FIG. 2, the first metal layer 130 is a scan line 132, the second metal layer 140 is a data line 143, and the insulating layer 160 and the black color resistance layer 120 are disposed at the intersection of the scan line 132 and the data line 143.

In this scheme, the scan line 130 and the data line 140 in the display panel 100 have an intersected and overlapped area in which a parasitic capacitance is generated between the scan line 130 and the data line 140, thereby increasing a circuit load of the data line 140 and the scan line 130; crosstalk will occur to a signal between the data line 140 and the scan line 130, so that the display panel 100 may present poor display; after adding the black color resistance layer 120 and the insulating layer 160 between the data line 140 and the scan line 130, a distance between the data line 140 and the scan line 130 may increase so as to decrease the parasitic capacitance therebetween, thereby avoiding interference of signal and guaranteeing performance of the display panel 100.

In one or more embodiments, as shown in FIGS. 4, 5, 6 and 7, the display panel 100 includes a semiconductor layer 150 disposed between the first metal layer 130 and the second metal layer 140; the first metal layer 130 forms a grid electrode 131; the second metal layer 140 forms a source electrode 141 and a drain electrode 142 that are independent of each other; the source electrode 141 is connected with the drain 142 through the semiconductor layer 150; the insulating layer is a grid electrode insulating layer 160 formed between the grid electrode 131 and the semiconductor layer 150; the black color resistance layer 120 is disposed on the grid electrode 131; a part of the black color resistance layer 120 covers the grid electrode 131, and another part does not cover the grid electrode 131; a part of the source electrode 141 is disposed on the black color resistance layer 120, and another part is disposed on the semiconductor layer 150; and at least a part of the drain electrode 142 is disposed on the semiconductor layer 150.

A part of the source electrode is disposed on the black color resistance layer, and another part is disposed on the semiconductor layer; at least a part of the drain electrode is disposed on the semiconductor layer; specifically, the source electrode 141 includes a first part 1411 and a second part 1412 that form an integrated structure; the first part 1411 is disposed on the part of the black color resistance layer 120 that covers the grid electrode 131; the second part 1412 is disposed on the part of the black color resistance layer 120 that does not cover the grid electrode 131; the drain electrode 142 includes a third part 1421 and a fourth part 1422; the first part 1411 and the second part 1412 form an integrated structure; the third part 1421 is disposed on the part of the black color resistance layer 120 that covers the grid electrode 131; and the fourth part 1422 is disposed on the part of the black color resistance layer 120 that does not cover the grid electrode 131.

In this scheme, the black color resistance layer 120 is disposed on the grid electrode 131; a part of the black color resistance layer 120 covers the grid electrode 131, and a part does not cover the grid electrode 131; the source electrode is divided into the first part 1411 and the second part 1412; the first part 1411 is disposed on the part of the black color resistance layer 120 that covers the grid electrode 131; the second part 1412 is disposed on the part of the black color resistance layer 120 that does not cover the grid electrode 131; since the first part 1411 of the black color resistance layer 120 is not in direct contact with the semiconductor layer 150, but a distance from the first part 1411 to the grid electrode 131 is greater than a distance from the second part 1412 to the grid electrode 131, the coupling capacitance of the first part 1411 and the grid electrode 131 is small; since the first part 1411 and the second part 1412 form an integrated structure, the overall capacitance of the source electrode 141 decreases, and the corresponding load of the source electrode 141 also decreases correspondingly; the second part 1412 is in contact with the semiconductor layer 150, and in the same way, the third part 1421 and the fourth part 1422 of the drain electrode 142 also realize the same function, and the load of the drain electrode 142 also decreases correspondingly. The second part and the fourth part 1422 are disposed on the part of the black color resistance layer that does not cover, so that the second part 1412 and the fourth part 1422 are in contact with the semiconductor layer 150, thereby forming the switch structure, e.g., the thin-film transistor (TFT), after completing the manufacture procedure of the display panel 100; such a switch structure may decrease the load of the grid electrode 131 and the source electrode 141 as well as the drain electrode 142, decrease the parasitic capacitance between the grid electrode and the source electrode and between the grid electrode and the drain electrode, improve the performance of the TFT, and while charging the pixel electrode, decrease the influence of the parasitic capacitance on charging of the pixel electrode, decrease kick back of the pixel electrode and guarantee the performance of the display panel 100.

Figure 6:
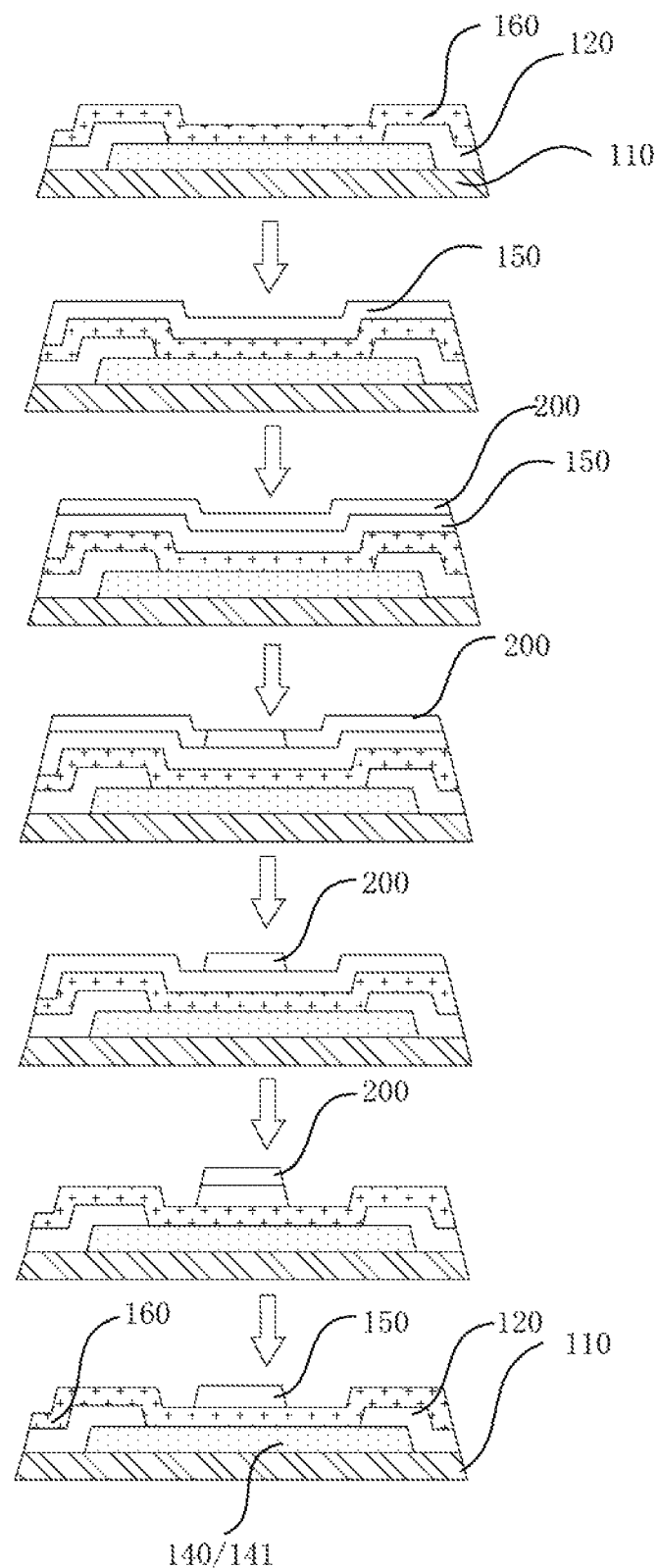
FIG. 6 is a schematic diagram of a display panel manufacture procedure of one or more embodiments in the present application.
Figure 7:
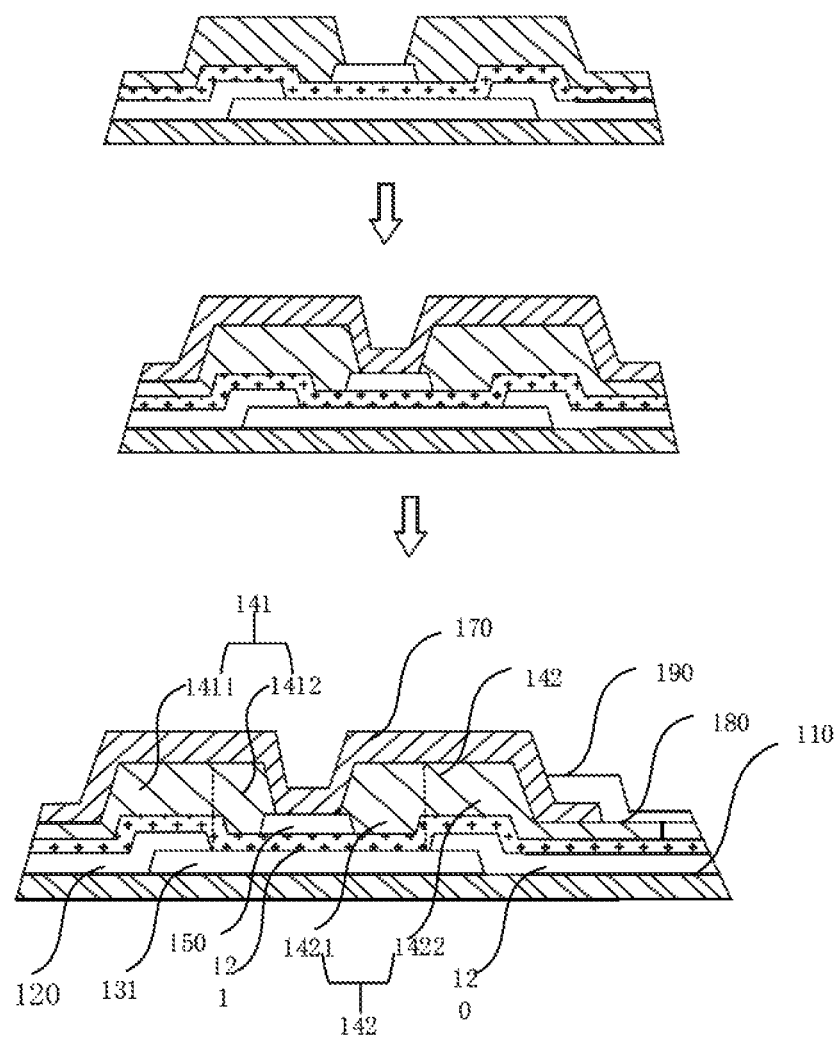
FIG. 7 is a schematic diagram of a display panel manufacture procedure of one embodiment in the present application.

In one or more embodiments, as shown in FIGS. 6 and 7, the grid electrode insulating layer 100 is formed on the black color resistance layer 120, and the semiconductor layer 150 is formed on the grid electrode insulating layer 160.

In this scheme, compared with the scheme in which the grid electrode 141 is provided with the display panel 100 of the grid electrode insulating layer 160, the grid electrode 131 is close to the backlight source; for example, in order to guarantee the opening 121 rate of the display panel 100, the grid electrode 131 insulating layer is made of a transparent insulating material; in addition, due to error of the manufacture procedure of the display panel 100, when the semiconductor layer 150 is disposed at the edge of the grid electrode 131, it is easily radiated by backlight so as to cause the semiconductor layer 150 to generate a current, thereby affecting display of the display panel 100; in this scheme, the black color resistance layer 120 is disposed on the grid electrode 131, so as to shield the backlight, prevent the backlight source from incoming into the semiconductor layer 150, guarantee normal work of the switch structure formed in this scheme, and at the same time, guarantee the performance of the display panel 100.

In one or more embodiments, the area of the semiconductor layer 150 is less than that of the grid electrode 131, and the semiconductor layer 150 is disposed corresponding to a non-edge area of the grid electrode 131.

In this scheme, compared with the setting manner in which the semiconductor layer 150 is disposed in an edge area of the grid electrode 131, due to the precision of the manufacture procedure of the display panel 100, the semiconductor and the grid electrode 131 present an occasion of dislocation, so that light from the backlight source will enter the semiconductor so as to cause the semiconductor layer 150 to generate a current, thereby affecting normal display of the display panel 100. The semiconductor layer 150 is disposed in the non-edge area of the corresponding grid electrode 131, in this way, it may avoid that the backlight enters the semiconductor layer 150; and the current generated by the semiconductor layer 150 due to lighting is eliminated to cause the display panel 100 to display normally.

Figure 8:
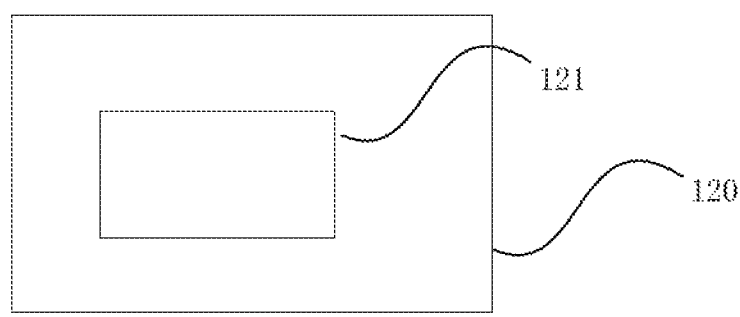
FIG. 8 is a structural schematic diagram of a display panel of one or more embodiments in the present application.
Figure 9:
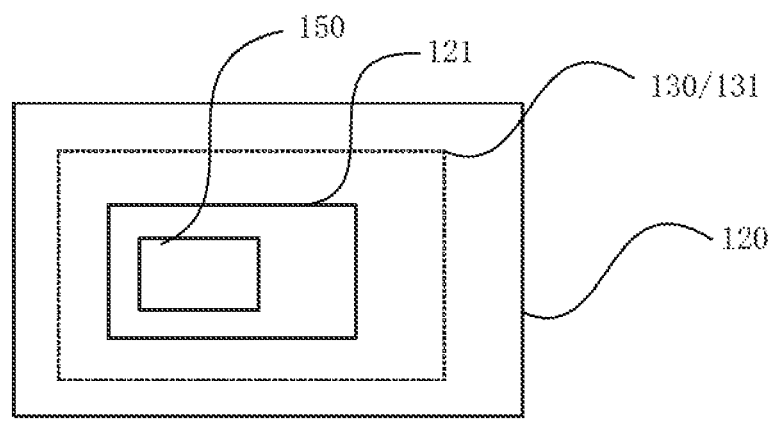
FIG. 9 is a schematic diagram of a display panel of one or more embodiments in the present application.

In one or more embodiments, referring to FIGS. 8 and 9, the black color resistance layer 120 is provided with an opening 121; a distance from the periphery of the opening 121 to the outer edge of the black color resistance layer 120 is greater than 0; and the semiconductor layer 150 is disposed in an area of the opening 121.

In this scheme, the black color resistance layer 120 is provided with an opening 121; a distance from the periphery of the opening 121 to the edge of the black color resistance layer 120 is greater than 0, then it indicates that the opening 121 is not disposed in the edge area of the black color resistance layer 120; if the opening 121 is disposed in the edge area of the black color resistance layer 120, it may cause a phenomenon that the backlight source leaks light, thereby affecting the quality of the display panel 100.

In one or more embodiments, as shown in FIGS. 4, 5, 6, 7 and 10, the present application discloses a manufacture method of a display panel 100, including the following steps:

S10: Provide a first substrate 110, and form a first metal layer 130;

S11: Form a black color resistance layer 120 and an insulating layer;

S13: Form a second metal layer 140;

The insulating layer and the black color resistance layer 120 are disposed between the first metal layer 130 and the second metal layer 140.

In this scheme, the black color resistance layer 120 is disposed between the first metal layer 130 and the second metal layer 140; since the black color resistance layer 120 has a certain thickness, and the black color resistance layer 120 is disposed to increase the distance between the first metal layer 130 and the second metal layer 140, so that coupling capacitance generated between the first metal layer 130 and the second metal layer 140 can decrease; and due to decrease of the coupling capacitance between the first metal layer 130 and the second metal layer 140, the circuit load of the first metal layer 130 and the second metal layer 140 decreases.

Figure 10:
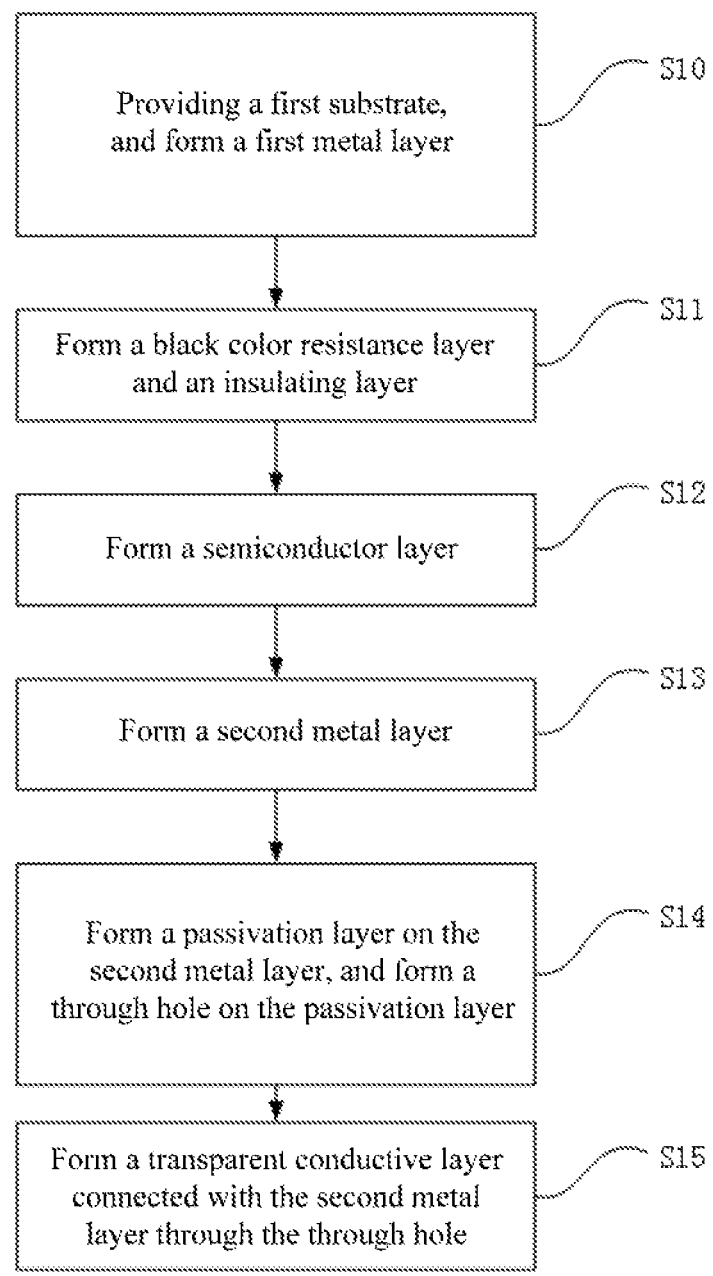
FIG. 10 is a schematic diagram of a display panel manufacture procedure of one or more embodiments in the present application.
Figure 11:
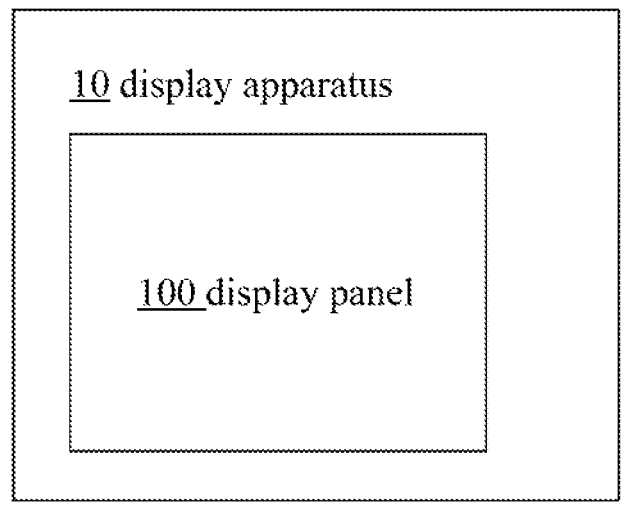
FIG. 11 is a schematic diagram of a display apparatus of one or more embodiments in the present application.

In one or more embodiments, referring to FIG. 10, after the step of forming the black color resistance layer 120 and the insulating layer 160, it further includes the following step:

S12: form a semiconductor layer 150.

After the step S13 of forming the second metal layer 140, it further includes the following steps:

S14: form a passivation layer 170 on the second metal layer 140, and form a through hole 180 on the passivation layer 170.

S15: form a transparent conductive layer 190 connected with the second metal layer 140 through the through hole 180.

Such a scheme forms a switch structure such as a thin film transistor (TFT). The grid electrode 131 is formed on the first substrate 110; the black color resistance layer 120 is formed on the grid electrode 131; an opening 121 is formed on the black color resistance layer 120; then a grid electrode insulating layer 160 is formed; the semiconductor layer 150 is disposed in a corresponding position of the opening 121; the source electrode 141 and the drain electrode 142 independent of each other are formed on the semiconductor layer 150; then the passivation layer 170 and the through hole 180 are formed; and finally the transparent conductive layer 190 is formed, thereby forming a complete thin film transistor (TFT) structure. The black color resistance layer 120 exists between the grid electrode 131 and the source electrode 141 and the drain electrode 142 to increase the distance therebetween, thereby decreasing the coupling capacitance and avoiding abnormal display of the display panel 100.

Certainly, such a scheme may also form a data line and a scan line, and similarly, the black color resistance layer 120 between the data line and the scan line increases the distance therebetween, thereby avoiding interaction effect of the data line and the scan line during signal transmission, and reducing abnormal display of the display panel 100.

In one or more embodiments, referring to FIG. 10, in the step of forming the black color resistance layer 120, the black color resistance layer 120 is formed with an opening 121 for forming the grid electrode insulating layer 160; the distance from the periphery of the opening 121 to the outer edge of the black color resistance layer 120 is greater than 0; and the semiconductor layer 150 is disposed in an area of the opening 121.

In this scheme, for the opening 121 of the black color resistance layer 120, it only requires to dispose a shading pattern related to the opening 121 on a mask used in an exposure process to form the opening 121; the manufacture procedure of the black color resistance layer 120 does not add any process step and is simple and practicable. In addition, the distance from the periphery of the opening 121 to the outer edge of the black color resistance layer 120 is greater than 0, which may avoid the light entering the semiconductor layer, avoid the semiconductor layer generating a current, and guarantee the performance of the display panel 100.

In one or more embodiments, as shown in FIGS. 3, 7, 10 and 11, the present application discloses a display apparatus 10 that includes the above-mentioned display panel 100.

It should be noted that, definition of various steps involved in this scheme is not deemed as definition to the order of the steps without affecting the specific scheme implementation; the steps mentioned first may be performed first or last, and may even be performed simultaneously; and as long as the steps can implement this scheme, they should be deemed as belonging to the protection scope of the present application.

The technical scheme of the present application may be widely applied to various display panels, e.g., a twisted nematic (TN) display panel, an in-plane switching (IPS) display panel, a vertical alignment (VA) display panel, a multi-domain vertical alignment (MVA) display panel, and certainly may also be other types of display panel, e.g., an organic light-emitting diode (OLED) display panel, which may all adapted to the above-mentioned scheme.

The above contents are detailed descriptions for the present application in conjunction with the specific optional implementation, and it cannot be affirmed that the specific implementation of the present application is only limited to these descriptions. For those skilled in the art of the present application, several simple deductions or replacements can further be made without departing from the idea of the present application and should be deemed as belonging to the scope of protection of the present application.

What is claimed is:

1. A display panel, comprising:
   a first substrate;
   a first metal layer formed on the first substrate;
   a second metal layer;
   an insulating layer formed between the first metal layer and the second metal layer; and
   a black color resistance layer formed between the first metal layer and the second metal layer;
   wherein the display panel further comprises a semiconductor layer disposed between the first metal layer and the second metal layer;
   wherein the first metal layer forms a gate electrode, the second metal layer forms a source electrode and a drain electrode that are independent of each other, and the source electrode is connected with the drain electrode through the semiconductor layer;
   wherein the insulating layer is a gate electrode insulating layer formed between the gate electrode and the semiconductor layer;
   wherein the black color resistance layer is disposed on the gate electrode: one part of the black color resistance layer covers the gate electrode and another part does not cover the gate electrode: a part of the source electrode is disposed on the black color resistance layer, and another part is disposed on the semiconductor layer; and at least a part of the drain electrode is disposed on the semiconductor layer.

2. The display panel according to claim 1, wherein, the gate electrode insulating layer is formed on the black color resistance layer; and the semiconductor layer is formed on the gate electrode insulating layer.

3. The display panel according to claim 1, wherein an area of the semiconductor layer is less than that of the gate electrode; and the semiconductor layer is disposed corresponding to a non-edge area of the gate electrode.

4. The display panel according to claim 1, wherein, the black color resistance layer comprises an opening; a distance from a periphery of the opening to an outer edge of the black color resistance layer is greater than 0; and the semiconductor layer is disposed in an area of the opening.

5. A manufacturing method of a display panel, comprising steps of:
   providing a first substrate, and forming a first metal layer on the first substrate;
   forming a black color resistance layer and an insulating layer over the first substrate;
   forming a semiconductor layer over the insulating layer;
   forming a second metal layer over the black color resistance layer and the insulating layer;
   forming a passivation layer on the second metal layer, and defining a through hole in the passivation layer;
   forming a transparent conductive layer coupled with the second metal layer through the through hole;
   wherein, the insulating layer and the black color resistance layer are disposed between the first metal layer and the second metal layer;
   wherein the first metal layer forms a gate electrode, the second metal layer forms a source electrode and a drain electrode that are independent of each other, and the source electrode is connected with the drain electrode through the semiconductor layer, wherein the insulating layer is a gate electrode insulating layer formed between the gate electrode; and wherein in the operation of forming the black color resistance layer, the black color resistance layer is formed with an opening for forming the gate electrode insulating layer.

6. The manufacturing method of a display panel according to claim 5, wherein a distance from a periphery of the opening to an outer edge of the black color resistance layer is greater than 0.

7. The manufacturing method of a display panel according to claim 6, wherein the semiconductor layer is disposed in an area of the opening.

8. A display apparatus, comprising a display panel that comprises:
   a first substrate;
   a first metal layer formed on the first substrate;
   a second metal layer;
   an insulating layer formed between the first metal layer and the second metal layer; and
   a black color resistance layer formed between the first metal layer and the second metal layer;
   wherein the display panel further comprises a semiconductor layer disposed between the first metal layer and the second metal layer;
   wherein the first metal layer forms a gate electrode, the second metal layer forms a source electrode and a drain electrode that are independent of each other, and the source electrode is connected with the drain electrode through the semiconductor layer;
   wherein the insulating layer is a gate electrode insulating layer formed between the gate electrode and the semiconductor layer;
   wherein the black color resistance layer is disposed on the gate electrode: one part of the black color resistance layer covers the gate electrode and another part does not cover the gate electrode: a part of the source electrode is disposed on the black color resistance layer, and another part is disposed on the semiconductor layer; and at least a part of the drain electrode is disposed on the semiconductor layer.

* * * * *